United States Patent
Hwang et al.

(10) Patent No.: US 6,583,477 B1
(45) Date of Patent: Jun. 24, 2003

(54) FIELD EMISSION DEVICE

(75) Inventors: Chi Sun Hwang, Daejon-Shi (KR); Yoon Ho Song, Daejon-Shi (KR); Jin Ho Lee, Daejon-Shi (KR); Kyoung Ik Cho, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/121,981

(22) Filed: Apr. 12, 2002

(30) Foreign Application Priority Data

Dec. 28, 2001 (KR) .......................... 2001-86833

(51) Int. Cl.⁷ .......................... H01L 29/06; H01L 23/62
(52) U.S. Cl. ................. 257/360; 257/10; 257/29.115 E; 257/29.204 E
(58) Field of Search .................. 257/360, 311, 257/10, 29.115 E, 29.204 E, 750, 758, 774; 438/20

(56) References Cited

U.S. PATENT DOCUMENTS 4,984,036 A * 1/1991 Sakamoto et al. .......... 257/284

FOREIGN PATENT DOCUMENTS

| JP | 11-149858 | * 6/1999 | ............. H01J/1/30 |
| JP | p200-251640 | * 9/2000 | |
| JP | p2001-6585 | * 12/2001 | ............. H01J/31/12 |
| KR | 1997-54932 | 10/1997 | ............. H01J/1/30 |

OTHER PUBLICATIONS

Asia Display / IDW '01, pp. 1161–1164.

* cited by examiner

Primary Examiner—Jasmine J B Clark
(74) Attorney, Agent, or Firm—Blakely Sokoloff Taylor & Zafman

(57) ABSTRACT

The present invention provides a field emission device driven with a high voltage. The field emission device of the present invention includes a resistor connected between a gate electrode and an external terminal to prevent a leakage current by an electrical connection between the gate electrode and the emitter. Therefore, the power consumption of the device is decreased and the operating characteristic of the device is improved.

5 Claims, 2 Drawing Sheets

FIELD EMISSION DEVICE

BACKGROUND OF THE INVENTION

1. Field of the Invention

The present invention relates generally to a field emission device, and more particularly to a field emission device capable of preventing generation of a leakage current due to an electrical shortage between a gate electrode and an emitter, which is generated by a high operating voltage.

2. Description of the Prior Art

A field emission device is used in a field emission-type display device, etc. The field emission-type display device is a device for which a research has been made as a next-generation flat panel display device following TFT-LCD.

The field emission device is mainly divided into a triode type and a diode type. The triode type includes a cathode having the emitter and the gate electrode, and an anode installed on the cathode. The emitter serves to emit electrons and is usually made of a tip shape. The gate electrode serves to control the amount of electrons generated from the emitter depending on the voltage applied thereto. The diode type has only one electrode at the cathode.

The present invention relates to a triode-type field emission device. A conventional triode-type field emission device will be below described.

FIG. 1 shows a conventional field emission device.

Referring now to FIG. 1, the conventional field emission device includes an emitter 104 for emitting electrons and made of a tip shape, a gate electrode 105 for controlling the amount of electrons generated from the emitter 104 depending on the voltage applied thereto, and an anode 107 positioned above the gate electrode 105, as a main component. The anode 107 is connected to the anode terminal 108 and the gate electrode 105 is then connected to the gate terminal 106.

Meanwhile the emitter 104 is connected to the switching means 103 for selectively supplying current to the emitter 104. The switching means 103 consists of a transistor and selectively supplies current from the source electrode 101 to the emitter 104 depending on the voltage applied to the gate electrode 102 of the transistor.

As shown in FIG. 1, the gate electrode 105 of the field emission device is formed around the emitter 104. A high voltage for discharging electrons from the emitter 104 is applied to the gate electrode 105. At this time, when the emitter 104 and the gate electrode 105 are electrically connected, sufficient difference of voltage between the emitter 104 and the gate electrode 105 is not formed to not only discharge electrons but also generate a leakage current. Thus, the power consumption is rapidly increasing.

Also, if the gate electrode 105 of the field emission device is connected to a gate, source or drain of a transistor due to electrical reason or process reason, sufficient difference of voltage between the emitter 104 and the gate electrode 105 of the field emission device is not formed to normally discharge elections while a leakage current is formed in a similar fashion.

If the leakage current is flowed as above, the difference in the voltage between the emitter 104 and the gate electrode 105 of the field emission device is accordingly reduced. The reduced amount is proportional to the multiplication of the leakage current and resistance. Therefore, as a sufficient voltage is not applied to the gate electrode 105 of the field emission device formed around a region where the leakage current is generated, a normal operation could not be performed.

Due to this, there are problems that the power consumption is increased and reliability of the device is degraded.

SUMMARY OF THE INVENTION

The present invention is contrived to solve the above problems. An object of the present invention is therefore to provide a field emission device capable of preventing increase of the power consumption and improving reliability of the device.

Another object of the present invention is to provide a field emission device comprising a gate electrode, an emitter, an anode, and a resistance element connected between the gate electrode and an external terminal to preventing a leakage current to the gate electrode or the emitter. The resistance element may use a resistor or a metal wiring a portion of which is thinly formed and thus has a high resistance.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
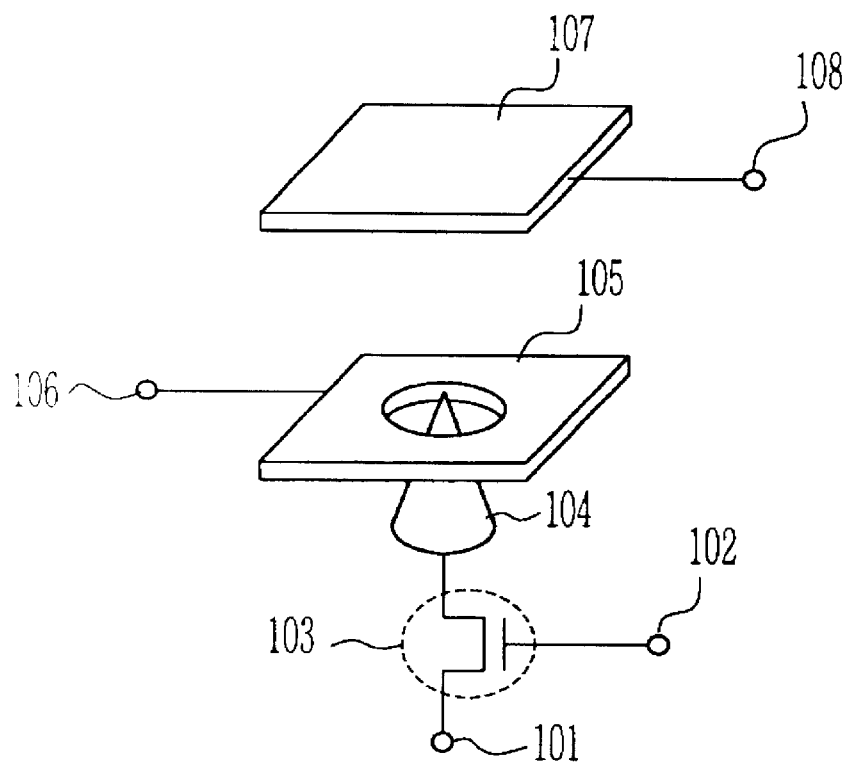
FIG. 1 shows a conventional field emission device.

The present invention will be described in detail by way of a preferred embodiment with reference to accompanying drawings, in which like reference numerals are used to identify the same or similar parts.

The field emission device proposed in the present invention has a structure in which a resistor is included at a pixel connection portion of a field emission electrode in a triode-type field emission device. It is required that the resistance of the resistor be small enough not to affect the field emission characteristic in a normal operation and be large enough to control the amount of the leakage current in a case that the field emission electrode is electrically connected to another electrodes.

Figure 2:
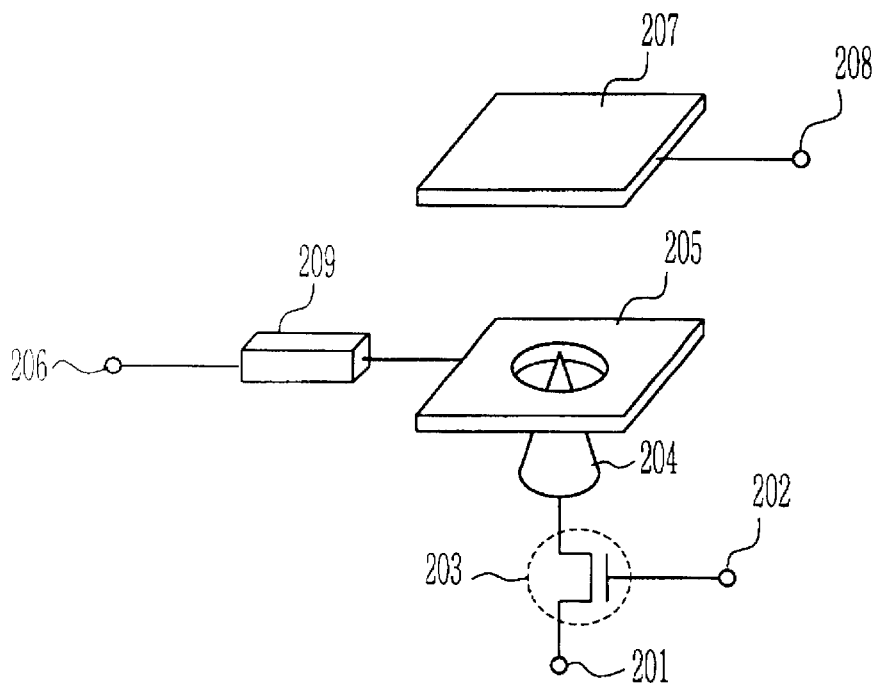
FIG. 2 shows a field emission device according to the present invention.

Referring now to FIG. 2, the field emission device according to the present invention includes an emitter 204 for discharging electrons and having a top shape, a gate electrode 205 for controlling the amount of electrons generated from the emitter 204 depending on the voltage applied thereto, an anode 207 positioned above the gate electrode 205, and a resistor 209 connected to the gate electrode 205. The anode 207 is connected to the anode terminal 208 and the gate electrode 205 is also connected to the gate terminal 206 via the resistor 209.

Meanwhile, the emitter 204 is connected to a switching means 203 for selectively supplying current to the emitter 204. The switching means 203 consists of a transistor and selectively supplies the current supplied to the source electrode 201 to the emitter 204, depending on the voltage applied to the gate electrode 202 of the transistor.

As seen from FIG. 2, the gate electrode 205 of the field emission device is formed around the emitter 204. A high voltage for discharging electrons from the emitter 204 is applied to the gate electrode 205.

Even though the emitter 204 and the gate electrode 205 are electrically connected due to a problem occurred in a manufacturing process or an operation, generation of the leakage current by the resistor 209 connected to the gate electrode 205 can be prevented.

Therefore, the difference in the voltage between the emitter 204 and the gate electrode 205 is sufficiently maintained, so that not only electrons can be smoothly discharged from the emitter 204 but also increase of the power consumption can be prevented.

In the above, the resistor 209 may use a common resistor or a metal wiring a portion of which is thinly formed and having a high resistance.

Further, it is required that the resistance of the resistor 209 be higher over ten times than that from the gate electrode 205 of the field emission device to the gate terminal 206. Also, it is required that the characteristic time, that is displayed as a multiplication with the driving capacitance of the emitter 204, satisfies the condition smaller than a reciprocal number of the speed to be driven.

A method of manufacturing the field emission device having the resistor will be below described.

Figure 3:
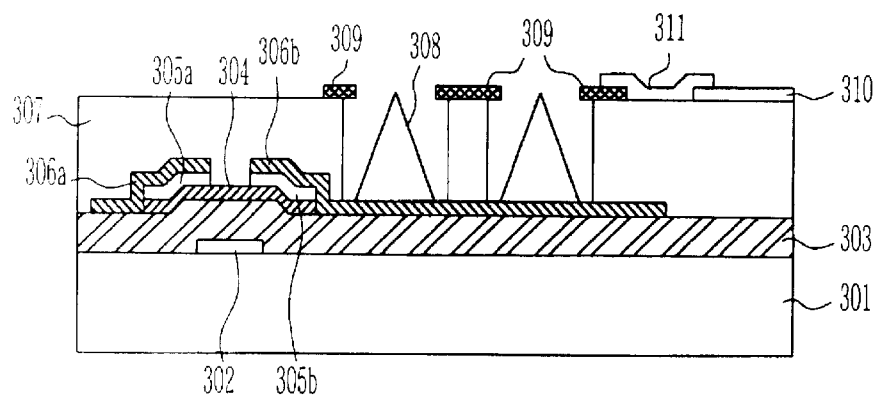
FIG. 3 to FIG. 5 are cross-sectional views for explaining a method of manufacturing the field emission device according to each of embodiments of the present invention.

FIG. 3 is a cross-sectional view for explaining a method of manufacturing the field emission device according to a first embodiment of the present invention.

Referring now to FIG. 3, a gate electrode 302 of a transistor is formed on a glass substrate 301. A gate insulating film 303 is then formed on the entire surface including the gate electrode 302. An activation layer 304 is formed on the gate insulating film 303 to cover the gate electrode 302. Then, source/drain 305a and 305b are each formed on edges of the activation layer 304 made of a n+ doping layer. A transistor for selectively supplying current to the emitter to control discharge of electrons is thus formed on the glass substrate 301. As such, the transistor consists of the gate electrode 302, the gate insulating film 303, the activation layer 304 and the source/drain 305a and 305b. The transistor has an inverted staggered structure being a common structure in an amorphous silicon transistor.

Thereafter, the source/drain electrodes 306a and 306b having a given pattern are formed on the gate insulating film 303 including the source/drain 305a and 305b, respectively. After an insulating layer 307 is formed on the entire structure, the insulating layer 307 is etched to form a hole through which a given region of the drain electrode 306b is exposed. An emitter 308 of a tip shape is formed on the drain electrode 306b exposed through the hole.

After the emitter 308 is formed, a gate electrode 309 of the field emission device is formed on the insulating layer 307 around the hole. Next, a metal wiring 310 for applying voltage to the gate electrode 309 or electrically connecting to an external terminal is formed. At this time, the metal wiring 310 is formed at a given distance from the gate electrode 309. The gate electrode 309 and the metal wiring 310 are connected via a resistor 311. The resistor 311 is made of a doped semiconductor or a conductor having a relatively high resistance and is formed by means of deposition and pattern process.

Thus, the field emission device in which the resistor 311 is connected between the gate electrode 309 and the metal wiring 310 is manufactured.

Figure 4:
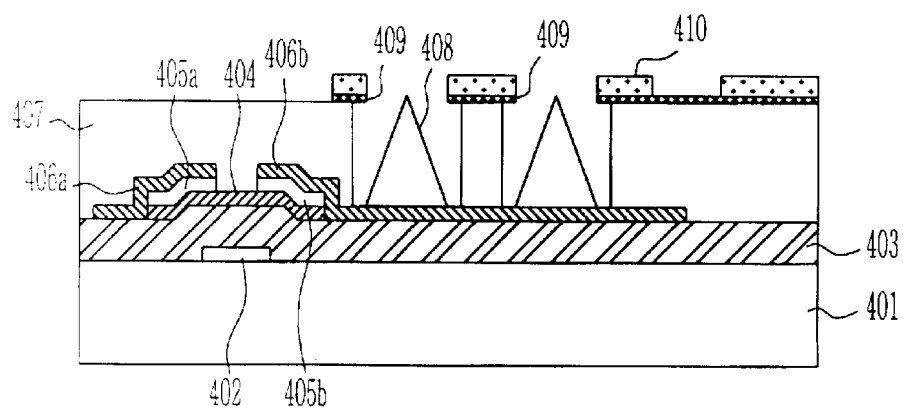

FIG. 4 is a cross-sectional view for explaining a method of manufacturing the field emission device according to a second embodiment of the present invention.

Referring now to FIG. 4, a transistor including a gate electrode 402, a gate insulating film 403, an activation layer 404, source/drain 405a and 405b, and source/drain electrodes 406a and 406b are formed on a glass substrate 401 by means of the same process mentioned in FIG. 3. After an insulating layer 407 is formed on the entire structure, the insulating layer 407 is etched to form a hole through which a given region of the drain electrode 406b is exposed. An emitter 408 of a tip shape is formed on the drain electrode 406b exposed through the hole is then formed.

After the emitter 408 is formed, a first gate electrode 409 of the field emission device made of a metal wiring is formed in a given pattern on the insulating layer 407 around the hole. Then, a second gate electrode 410 is formed on remaining regions except for a given region on the first gate electrode 409. The first gate electrode 409 in a region where the second gate electrode 410 is thus not formed serves as a resistor, thus completing the field emission device having a resistor.

As above, the gate electrode in the field emission device has a structure in which the first and second gate electrodes 409 and 410 are stacked. At this time, the first gate electrode 409 serves as not only the gate electrode but also an electrode and a connection portion connected to an external terminal. Meanwhile, the second gate electrode 410 serves as only the gate electrode and the external terminal of the pixel. At this time, the first gate electrode 409 is made of a material having a high resistance and the second gate electrode 410 is made of a material having a low resistance. Therefore, the resistance of the connection portion to be connected to outside of the pixel can be high while the resistance of the gate electrode is low.

Figure 5:
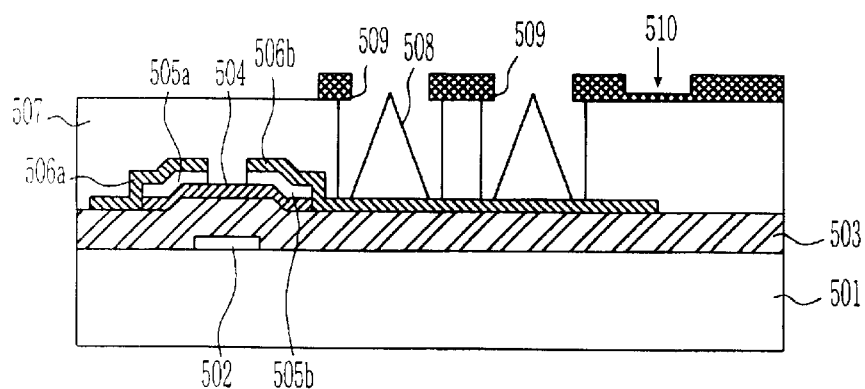

FIG. 5 is a cross-sectional view for explaining a method of manufacturing the field emission device according to a third embodiment of the present invention.

Referring now to FIG. 5, a transistor including a gate electrode 502, a gate insulating film 503, an activation layer 504, source/drain 505a and 505b, and source/drain electrodes 506a and 506b are formed on a glass substrate 501 by means of the same process mentioned in FIG. 3. After an insulating layer 507 is formed on the entire structure, the insulating layer 507 is etched to form a hole through which a given region of the drain electrode 506b is exposed. An emitter 508 of a tip shape is formed on the drain electrode 506b exposed through the hole is then formed.

After the emitter 508 is formed, a first gate electrode 509 of the field emission device made of a metal wiring is formed in a given pattern on the insulating layer 507 around the hole. Thereafter, a given region of the gate electrode 509 is etched by a desired thickness by means of lithography process and etching process to form a thin gate electrode 510. At this time, the amount of resistance is controlled by the thickness of portions remained after the partial etching. This method can simplify the process in that it forms a resistor using a single material.

Thereby, as the thin portion of the gate electrode 510 serves as a resistor, the field emission device having the resistor is manufactured.

As such, according to the present invention, a triode-type field emission device having a resistor is provided. The resistor is existed between the gate electrode and the external terminal. The leakage current can be minimized due to the resistor even though the gate electrode is electrically connected with the emitter or other electrode of the pixel.

In order to minimize the amount of the leakage current, it is required that the resistance of the resistor is higher ten times than that from the external terminal to the gate electrode. Meanwhile, if the resistance of the resistor is too high, the driving speed of the device may lower. Therefore, it is required that the characteristic time, which is displayed as a multiplication with the driving capacitance of the emitter, be smaller than a reciprocal number of the speed to be driven.

Another advantage to be obtained by having the resistor is that decrease in the voltage of the gate electrode formed around the pixel can be prevented. More particularly, in case of an active driving-type field emission device, the gate electrode is usually constructed to be an electrode common to entire device regions. Even in this case, affect of one damaged pixel on another pixel can be prevented.

As mentioned above, the present invention has an advantage that it can prohibit generation of the leakage current by connecting the resistor to the gate electrode of the field emission device. The present invention can thus prevent increase in the power consumption and improve reliability of the device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A field emission device comprising:
   an emitter having a tip shape for emitting electrons;
   a switching means, connected to said emitter, for selectively supplying current to said emitter;
   a gate electrode formed around said emitter, high voltage being applied to said gate electrode in order to emit electrons from said emitter;
   an anode positioned above said gate electrode and said emitter; and
   a resistance element, connected between said gate electrode and a gate terminal, for maintaining voltage difference between said emitter and said gate electrode.

2. The field emission device as claimed in claim 1, wherein said resistance element is a resistor.

3. The field emission device as claimed in claim 1, wherein said resistance element is a metal wiring a portion of which is thinly formed and having a large resistance.

4. The field emission device as claimed in claim 3, wherein said metal wiring includes first metal wiring portion, and second metal wiring portion having two parts separately stacked on both ends of the first metal wiring portion, the first metal wiring portion having a resistance higher than that of the second metal wiring portion.

5. The field emission device as claimed in claim 1, wherein said resistance element has a resistance higher about ten times than the resistance between said gate electrode and said gate terminal, and a characteristic time which satisfies a condition smaller than a reciprocal number of the speed to be driven.

* * * * *